United States Patent
Goto

(10) Patent No.: US 9,224,780 B2
(45) Date of Patent: Dec. 29, 2015

(54) COMPLEMENTARY METAL-OXIDE-SEMICONDUCTOR (CMOS) IMAGE SENSOR INCLUDING A JUNCTION FIELD EFFECT TRANSISTOR

(71) Applicant: SAMSUNG ELECTRONICS CO., LTD., Suwon-si, Gyeonggi-do (KR)

(72) Inventor: Hirosige Goto, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 276 days.

(21) Appl. No.: 13/833,302

(22) Filed: Mar. 15, 2013

(65) Prior Publication Data
US 2013/0320196 A1 Dec. 5, 2013

(30) Foreign Application Priority Data
May 31, 2012 (KR) ................ 10-2012-0058318

(51) Int. Cl.
*H01L 27/146* (2006.01)
(52) U.S. Cl.
CPC .... *H01L 27/14643* (2013.01); *H01L 27/14603* (2013.01); *H01L 27/14612* (2013.01); *H01L 27/14641* (2013.01)
(58) Field of Classification Search
IPC .................. H01L 27/14609, 27/1463, 27/14643, H01L 27/1468; H04N 5/35527
See application file for complete search history.

(56) References Cited

U.S. PATENT DOCUMENTS

| 2006/0284177 A1 | 12/2006 | Hynecek |
| 2007/0057158 A1* | 3/2007 | Hong ............ 250/214.1 |
| 2008/0151091 A1 | 6/2008 | Hynecek |
| 2011/0192961 A1 | 8/2011 | Kuwazawa |

FOREIGN PATENT DOCUMENTS

| JP | 2006-010849 A | 1/2006 |
| JP | 2006-0108497 A | 4/2006 |
| JP | 2008-160133 A | 7/2008 |
| KR | 10-2006-0131265 A | 12/2006 |
| KR | 10-2009-0055771 A | 6/2009 |
| KR | 10-2011-0065176 A | 6/2011 |
| KR | 10-2011-0079325 A | 7/2011 |

* cited by examiner

*Primary Examiner* — Francis M Legasse, Jr.
(74) *Attorney, Agent, or Firm* — Lee & Morse, P.C.

(57) ABSTRACT

An image sensor includes a sensing node to sense photo charges output from a photodiode. The sensing node includes a first dopant region of a first conductivity type and a second dopant region of a second conductivity type. The second dopant region surrounds the first dopant region. A third dopant region of the first conductivity type is adjacent to the second dopant region and is disposed around the sensing node. The first, second, and third dopant regions operate as a source, a gate, and a drain of a junction field effect transistor, respectively.

18 Claims, 21 Drawing Sheets

© COMPLEMENTARY
METAL-OXIDE-SEMICONDUCTOR (CMOS)
IMAGE SENSOR INCLUDING A JUNCTION
FIELD EFFECT TRANSISTOR

CROSS-REFERENCE TO RELATED
APPLICATIONS

The present application claims priority under 35 U.S.C. §119 to Korean Patent Application No. 10-2012-0058318, filed on May 31, 2012, in the Korean Intellectual Property Office, and entitled: "Complementary Metal-Oxide-Semiconductor (CMOS) Image Sensor," which is incorporated by reference herein in its entirety.

BACKGROUND

1. Field

The inventive concept relates to an image sensor and, more particularly, to a CMOS image sensor of a three-transistor (3-T) structure.

2. Description of the Related Art

Sensor devices may sense effective physical quantities such as an intensity of light, temperature, mass, and time to output electrical signals. The sensor devices are widely used in many fields. Particularly, an image sensor includes a pixel array detecting an image of a subject for photography. The image sensor may be applied to various fields.

SUMMARY

Embodiments of the inventive concept may provide a CMOS image sensor capable of improving integration degree thereof.

Embodiments of the inventive concept may also provide a CMOS image sensor capable of securing an output signal having an improved signal-noise (SN) ratio by a new charge detecting method.

In one aspect, an image sensor may a photodiode configured to convert a received optical signal into photo charges and to output the photo charges, a sensing node adjacent to the photodiode and configured to sense the photo charges, the sensing node including a first dopant region having dopants of a first conductivity type, and a second dopant region having dopants of a second conductivity type, the second dopant region surrounding the first dopant region, and a driver configured to convert the sensed photo charges into an electrical signal and to output the electrical signal.

The driver may include a selection transistor configured to operate as a source follower outputting a signal according to a voltage level of the sensing node, a source of the selection transistor being connected to the first dopant region.

A drain of the selection transistor may be connected to an output terminal.

The image sensor may further include a first voltage and a current source connected in series to the drain of the selection transistor.

The image sensor may further include a third dopant region adjacent to the second dopant region and having dopants of the first conductivity type, the third dopant region being disposed around the sensing node.

The image sensor may further comprising a transfer transistor disposed between the photodiode and the sensing node, the transfer transistor being configured to transfer the photo charges into the sensing node in response to a transfer control signal.

The image sensor may further include a reset transistor connected to a second voltage and to the second dopant region of the sensing node, the reset transistor being configured to reset the second dopant region to a voltage level of the second voltage in response to a reset control signal.

The transfer transistor and the reset transistor may be connected in common to the second dopant region.

The first dopant region, the second dopant region, and the third dopant region may be configured to operate as a source, a gate, and a drain of a junction field effect transistor, respectively.

The first voltage may have a higher voltage level than the second voltage.

The transfer transistor may be configured to be turned-on by the transfer control signal, such that a voltage level of the sensing node is changed from the voltage level of the second voltage into a voltage level generated by the photo charges transferred from the photodiode.

In one aspect, an image sensor may include a photodiode configured to convert a received optical signal into photo charges and to output the photo charges, a sensing node adjacent to the photodiode and configured to sense the photo charges, a transfer transistor connected between the photodiode and the sensing node, and a selection transistor connected between the sensing node and an output terminal, the selection transistor being configured to operate as a source follower and to output a voltage level corresponding to the photo charges of the sensing node through the output terminal in response to a selection control signal.

The sensing node may include a first dopant region having dopants of a first conductivity type, and a second dopant region having dopants of a second conductivity type, the second dopant region surrounding the first dopant region.

The image sensor may further include a third dopant region adjacent to the second dopant region and disposed around the sensing node, the third dopant region having dopants of the first conductivity type.

A source of the selection transistor may be connected to the first dopant region.

A drain of the selection transistor may be connected between a first voltage and the output terminal.

The image sensor may further include a reset transistor connected to a second voltage and the second dopant region of the sensing node, the reset transistor being configured to reset the second dopant region to a voltage level of the second voltage in response to a reset control signal.

The transfer transistor and the reset transistor may be connected in common to the second dopant region.

The first dopant region, the second dopant region, and the third dopant region may be configured to operate as a source, a gate, and a drain of a junction field effect transistor, respectively.

The first voltage may have a higher voltage level than the second voltage.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
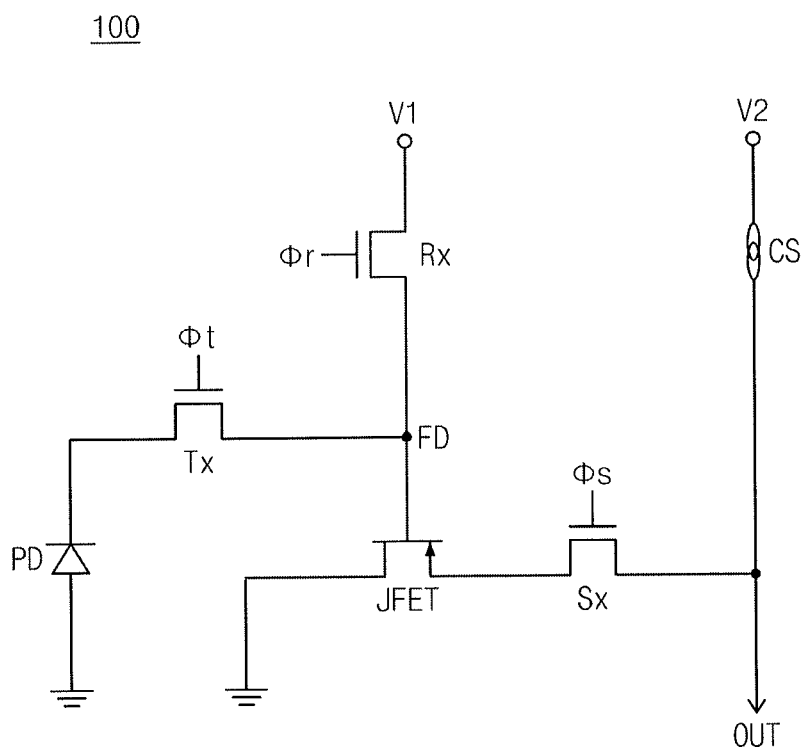
FIG. 1 illustrates a circuit diagram of a unit pixel constituting an image sensor according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

In embodiments of the inventive concept, a pixel of an image sensor may be driven by a front-side illumination sensor (FIS) or a back-side illumination sensor (BIS) method.

Hereinafter, charges generated and accumulated by light may be referred to as electrons for the purpose of ease and convenience in explanation. However, the inventive concept is not limited thereto. In other embodiments, the generated and accumulated charges may be holes. In this case, a setting voltage and a polarization of a semiconductor region of an image sensor may be different from those described below.

Figure 2:
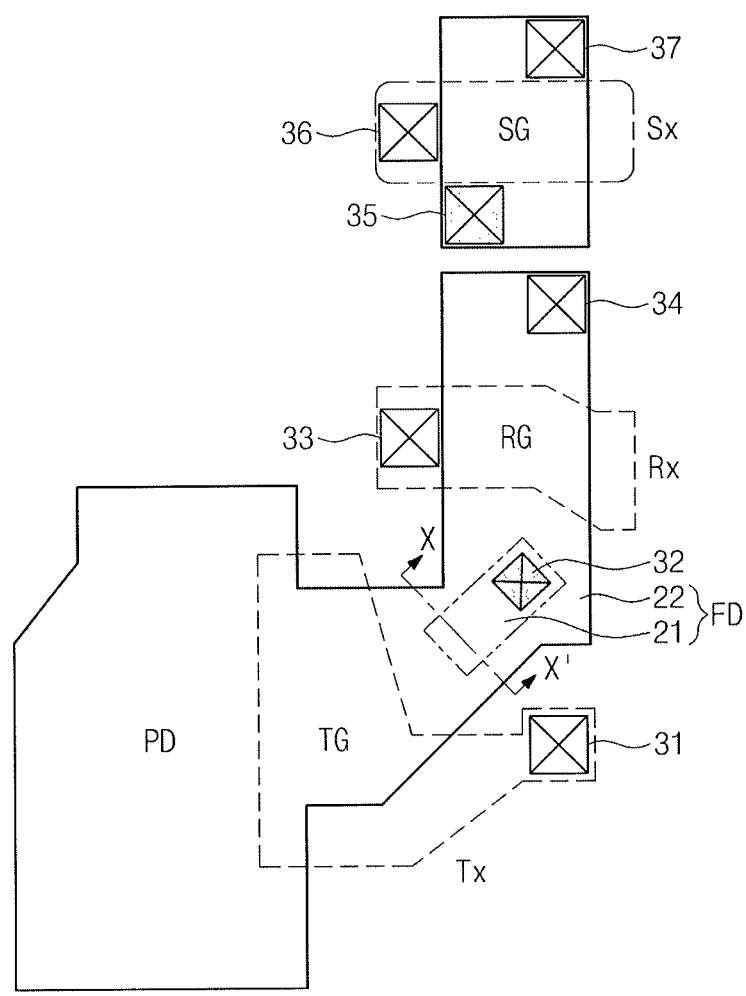
FIG. 2 illustrates a plan view of a pixel of an image sensor according to embodiments of the inventive concept.

FIG. 1 illustrates a circuit diagram of a unit pixel constituting an image sensor according to embodiments of the inventive concept. FIG. 2 illustrates a plan view of a pixel of an image sensor according to embodiments of the inventive concept.

Referring to FIGS. 1 and 2, a pixel 100 of an image sensor may include a photodiode PD, a transfer transistor Tx, a reset transistor Rx, and a selection transistor Sx. In other words, the pixel 100 of the image sensor according to embodiments may have a structure including one photodiode PD and three transistors (3T). A floating sensing node FD is connected to the transfer transistor Tx and the reset transistor Rx.

The photodiode PD may include a P-type dopant doped region and an N-type dopant doped region. The photodiode PD accumulates and outputs photo charges generated by incident light.

The transfer transistor Tx may transfer the photo charges accumulated in the photodiode PD to the floating sensing node FD. The transfer transistor Tx includes a transfer gate TG. The photodiode PD and the floating sensing node FD may be used as source/drain junctions of the transfer transistor Tx. The transfer transistor Tx is controlled by a transfer control signal Φt. The transfer control signal Φt is input to the transfer gate TG through a first contact 31.

The floating sensing node FD includes a first dopant region 21 and a second dopant region 22 surrounding the first dopant region 21. The first dopant region 21 may be isolated by the second dopant region 22. The first dopant region 21 may have a P-type conductivity type, and the second dopant region 22 may have an N-type conductivity type. The second dopant region 22 may be used as a source/drain junction of the reset transistor Rx and a source/drain junction of the transfer transistor Tx. In other words, the reset and transfer transistors Rx and Tx may share the second dopant region 22. The first dopant region 21 is connected to the selection transistor Sx through a second contact 32 and a fifth contact 35. The second contact 32 is connected to the first dopant region 21, and the fifth contact 35 is connected to a source of the selection transistor Sx.

The reset transistor Rx includes a reset gate RG. The second dopant region 22 of the floating sensing node FD is used as a source of the reset transistor Rx. A drain of the reset transistor Rx is connected to a fourth contact 34. The reset transistor Rx resets the second dopant region 22 of the floating sensing node FD to a voltage level of a first voltage V1. The reset transistor Rx is controlled by a reset control signal Φr. The reset control signal Φr is input to the reset gate RG through a third contact 33. The fourth contact 34 electrically connects the drain of the reset transistor Rx to the first voltage V1.

The selection transistor Sx includes a selection gate SG. The source of the selection transistor Sx is electrically connected to the first dopant region 21 of the floating sensing node FD through the fifth contact 35. The selection gate SG is input with a selection control signal Φs through a sixth contact 36. A seventh contact 37 electrically connects a drain of the selection transistor Sx to a second voltage V2. The drain of the selection transistor Sx is connected to an output terminal OUT. The output terminal OUT is connected in series to a current source CS and the second voltage V2. The first voltage V1 may have a higher voltage level than the second voltage V2.

As described above, the floating sensing node FD and the selection transistor Sx are connected to each other through a junction field effect transistor (JFET) formed by the first dopant region 21 and the second dopant region 22 of the floating sensing node FD. This will be described in more detail below with reference to FIG. 3 to.

Figure 3:
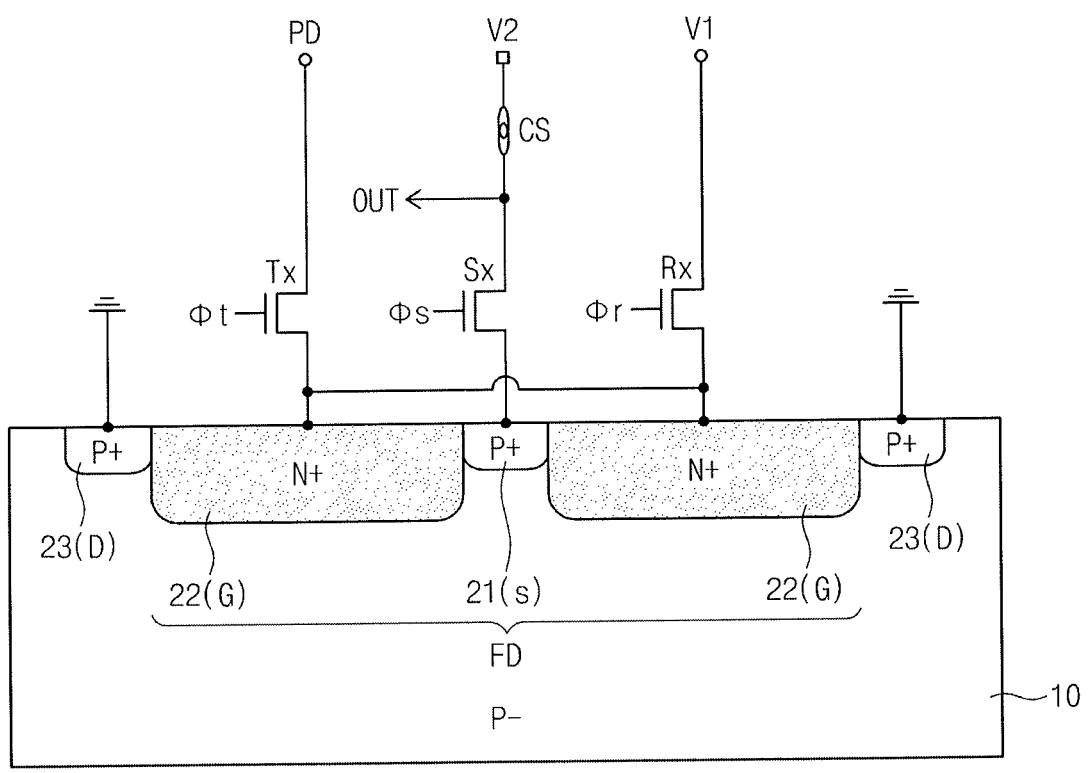
FIG. 3 illustrates a cross-sectional view taken along line X-X' of FIG. 2 to explain a pixel of an image sensor according to some embodiments of the inventive concept.

FIG. 3 illustrates a cross-sectional view taken along line X-X' of FIG. 2 to explain a pixel of an image sensor according to some embodiments of the inventive concept.

Referring to FIG. 3, the pixel 100 of an image sensor according to some embodiments includes the floating sensing node FD formed in a substrate 10. The substrate 10 may have a P-type conductivity type. The floating sensing node FD includes the first dopant region 21 and the second dopant region 22. The second dopant region 22 may surround and isolate the first dopant region 21. The first dopant region 21 has the P-type conductivity type, and the second dopant region 22 has the N-type conductivity type. A third dopant region 23 is disposed in the substrate 10 around the second dopant region 22. The third dopant region 23 is adjacent to the second dopant region 22. The third dopant region 23 has the P-type conductivity type.

The second dopant region 22 is connected to the source of the reset transistor Rx and the drain of the transfer transistor Tx. The first dopant region 21 is electrically connected to the source of the selection transistor Sx. The third dopant 23 is grounded, e.g., the third dopant 23 may be connected to a ground voltage.

Figure 4:
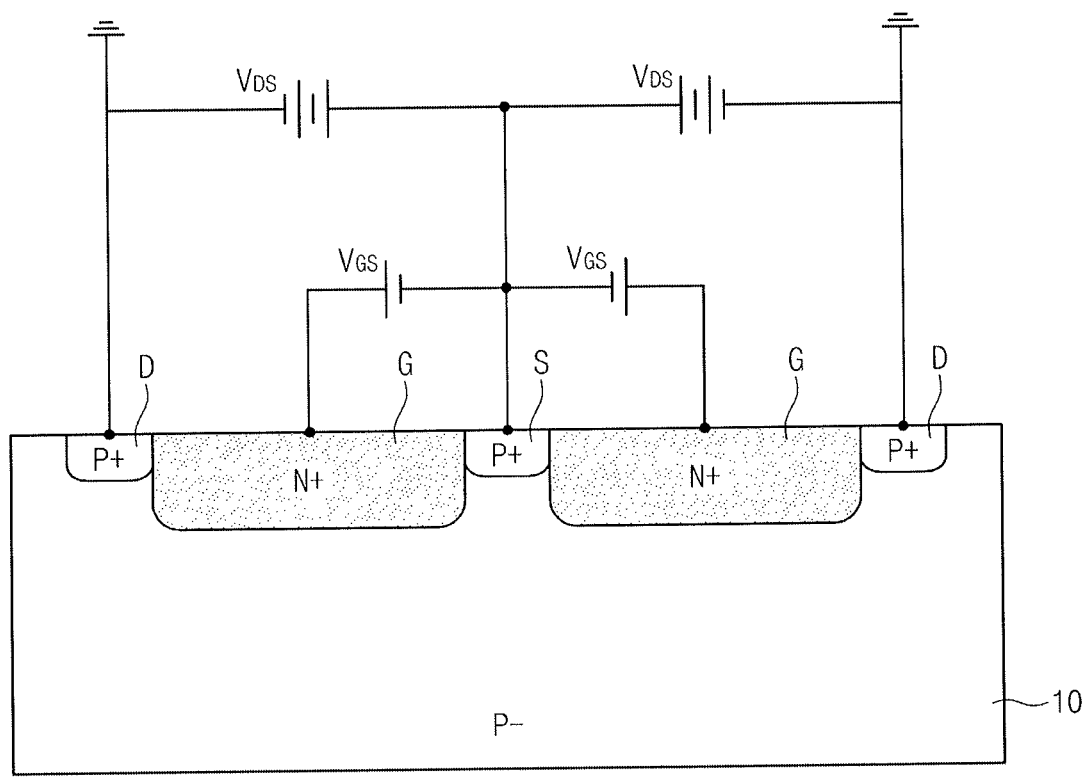
FIGS. 4 and 5 illustrate cross-sectional views taken along line X-X' of FIG. 2 to explain a method of operating an image sensor according to some embodiments of the inventive concept.
Figure 5:
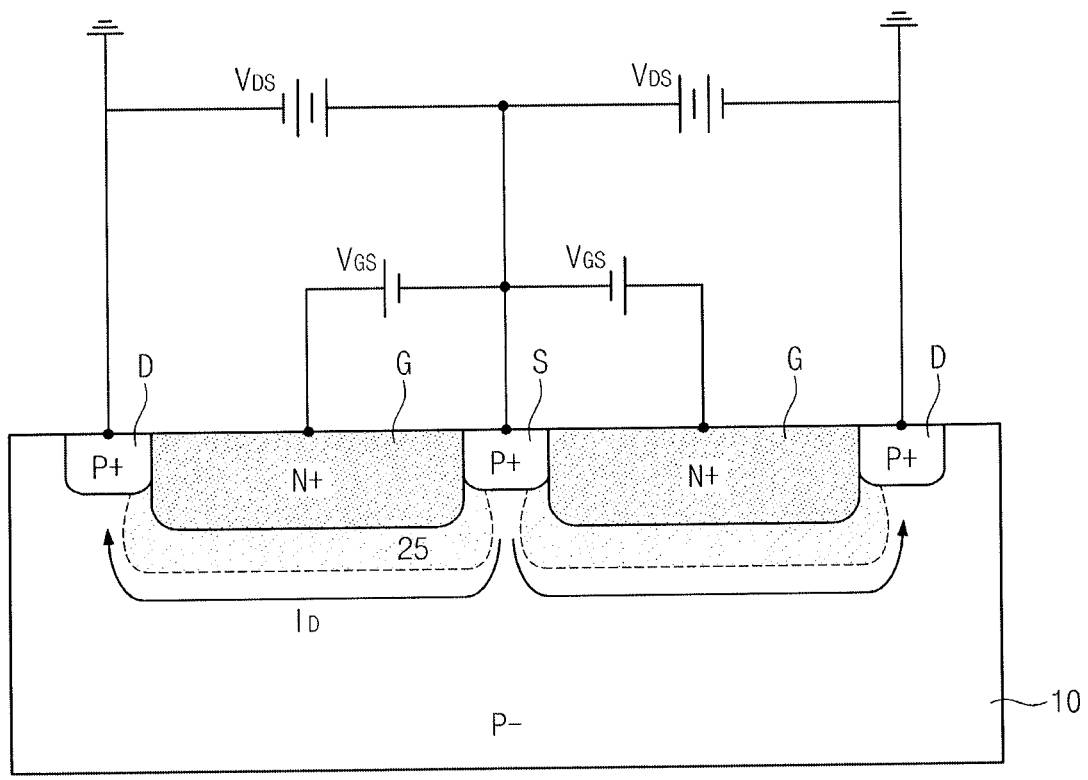

A method of operating the image sensor according to some embodiments will be described hereinafter with reference to FIGS. 4 and 5. FIGS. 4 and 5 illustrate cross-sectional views taken along line X-X' of FIG. 2.

Referring to FIGS. 3 to 5, the first and second dopant regions 21 and 22 of the floating sensing node FD and the third dopant region 23 may be operated as a P-channel JFET. The second dopant region 22 of the floating sensing node FD may function as a gate G of the JFET, the first dopant region 21 of the floating sensing node FD may function as a source of the JFET, and the third dopant region 23 may function as a drain (D) of the JFET. A depletion layer 25 is formed by a PN junction between the substrate 10 of the P-type and the second dopant region 22 of the N-type, as illustrated in FIG. 5. The depletion layer 25 controls conductance of a channel of the JFET.

A drain source voltage $V_{DS}$ of a positive voltage is applied between the drain D and the source S of the JFET. A gate source voltage $V_{GS}$ is applied between the gate G and the source S of the JFET. A thickness of the depletion layer 25 varies by the gate source voltage $V_{GS}$. The thickness variation of the depletion layer 25 influences a flow of holes from the source S to the drain D. Thus, a drain current $I_D$ can be controlled.

If an output signal is not generated from the photodiode PD, the selection transistor Sx is turned-off by the selection control signal Φs, and the output terminal OUT connected to the current source CS maintains the voltage level of the second voltage V2. If an output signal is generated from the photodiode PD, the selection transistor Sx is turned-on by the selection control signal Φs, and the voltage level of the output terminal OUT connected to the current source CS varies by the operation of the P-channel JFET described above.

The method of operating the image sensor will be described in more detail hereinafter.

In a reset operation, the reset transistor Rx is turned-on, and the voltage level of the first voltage V1 is applied to the second dopant region 22 corresponding to the gate G of the JFET. Thus, electrons accumulated in the second dopant regions 22 of the floating sensing node FD are removed. The thickness of the depletion layer 25 increases by the gate source voltage $V_{GS}$ applied to the PN junction between the source S and the gate G. At this time, the selection transistor Sx is turned-off.

The reset transistor Rx is turned-off, and the selection transistor Sx is turned-on. When the selection transistor Sx is turned-on, the drain current $I_D$ is generated to flow through the substrate 10 under the depletion layer 25, so that the voltage level of the output terminal OUT is reduced to a reference voltage Vref slightly lower than the second voltage V2.

Thereafter, the transfer transistor Tx is turned-on, such that the photo charges generated in the photodiode PD are transferred into the second dopant region 22 of the floating sensing node FD. Electrons corresponding to the photo charges transferred from the photodiode PD are accumulated in the second dopant regions 22. Thus, the voltage level of the gate G of the P-channel JFET is reduced, such that a gate source voltage $V_{GS}$ applied between the gate G and the source S of the P-channel JFET may be reverse to the gate source voltage $V_{GS}$ in the reset operation, so as to reduce the thickness of the depletion layer 25. The thickness of the depletion layer 25 is reduced to increase the drain current $I_D$ between the source S and the drain D. Thus, the voltage level in the output terminal OUT is further reduced as compared with the second voltage V2. As a result, the voltage level of the output terminal OUT becomes a pixel voltage Vpix.

As described above, the selection transistor Sx in itself performs an operation of a source follower.

Figure 6:
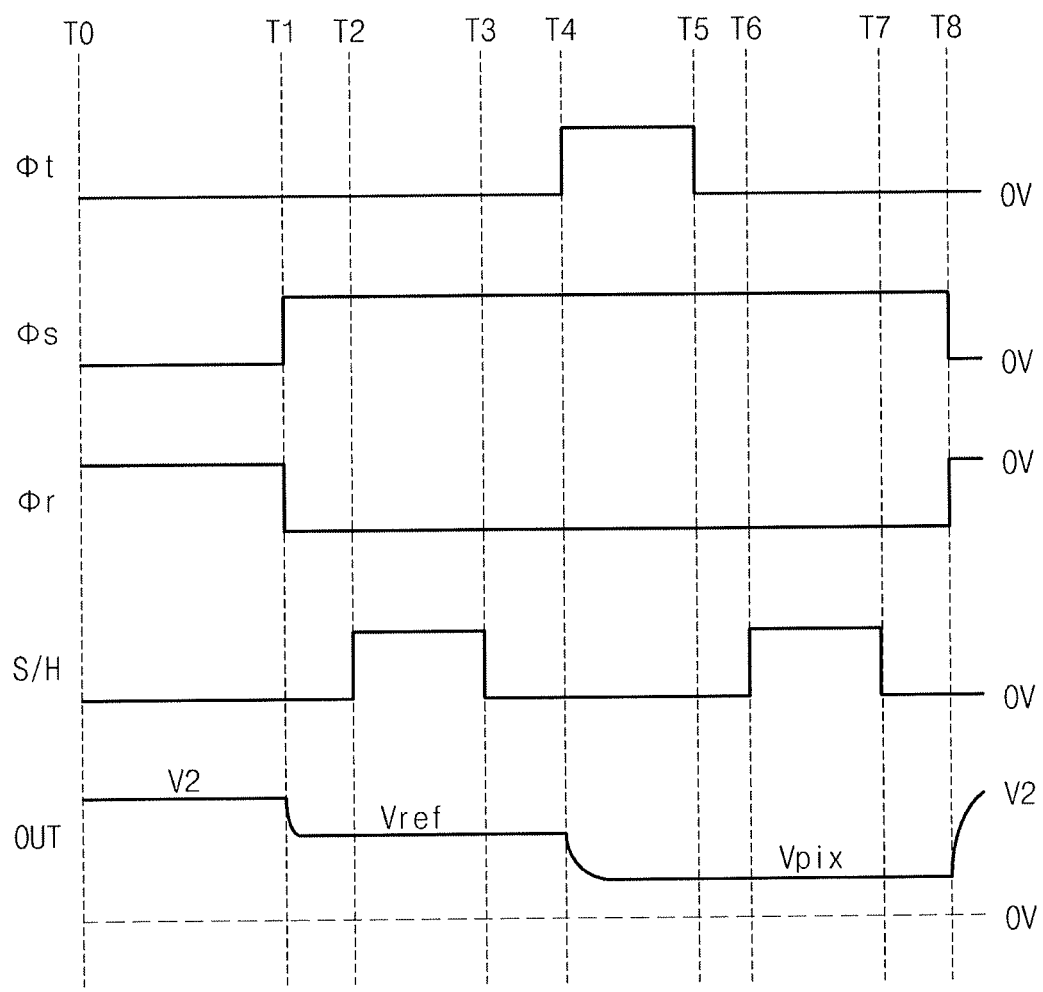
FIG. 6 illustrates a timing diagram of a method of operating an image sensor according to embodiments of the inventive concept.

FIG. 6 illustrates a timing diagram of a method of operating an image sensor according to embodiments of the inventive concept.

Referring to FIG. 6, the CMOS image sensor according to embodiments may perform a correlated double sampling (CDS) operation. The CDS operation will be described hereinafter. The reset control signal Φr becomes 'logic high' at a time of 'T0' to reset the floating sensing node FD of each of the pixels located in a corresponding row of a pixel array. The reset control signal Φr becomes 'logic low' at a time of 'T1'. At this time, the selection control signal Φs becomes 'logic high' to output reset values for the CDS.

The output reset values are sampled in a 'logic high' period of sample/hold (S/H) represented by 'T2' and 'T3'. The reference voltage Vref is outputted. Here, the S/H signal may be analyzed into an analog to digital conversion (ADC) start signal or a signal temporarily storing the reset values in a sample and hold circuit according to a method of reading the reset values. The S/H signal may be variously analyzed by various methods such as analog CDS, digital CDS, and/or dual CDS.

The photodiode PD may receive light at the 'T0', or from a time prior to the 'T0'. The photo charges generated through photoelectric conversion caused by the light are transferred into the floating sensing node FD by the transfer control signal Φt having a 'logic high' state at 'T4'.

The pixel voltage Vpix corresponding to the photo charges generated in the photodiode PD by the received light is outputted during a period from the 'T4' to 'T5'. A photo gate may be disposed on or under the photodiode PD. The photo gate may be electrically connected to the photodiode PD. In this case, a negative or positive voltage may be applied to the photo gate according to a kind of the photo charges for improving optical transmission efficiency.

The output values are sampled by the S/H signal represented by 'T6' and 'T7'. An operating method in a period between the 'T6' and 'T7' may be substantially the same as the operating method in the period between the 'T2' and 'T3'. In other words, the operating method in the period between the 'T6' and 'T7' may be changed depending on the CDS operation and a driving method of the image sensor.

The selection control signal Φs is changed into a 'logic low' state at 'T8' to finish the CDS operation of the corresponding row. The reset control signal Φr is changed into the 'logic high' state again to perform the reset operation for the next data output.

A reference designator 'OUT' represents a voltage of the output terminal. The voltage of the output terminal OUT sequentially maintains the second voltage V2 and the reference voltage Vref in a period from the 'T0' to the 'T4'. The voltage of the output terminal OUT is changed into the pixel voltage Vpix in the period from the 'T4' to the 'T5' which outputs the sensing data of the photodiode PD. The voltage of the output terminal OUT maintains the pixel voltage Vpix in a period from 'T6' to 'T7' which outputs the voltage level of the sensing data.

Figure 7:
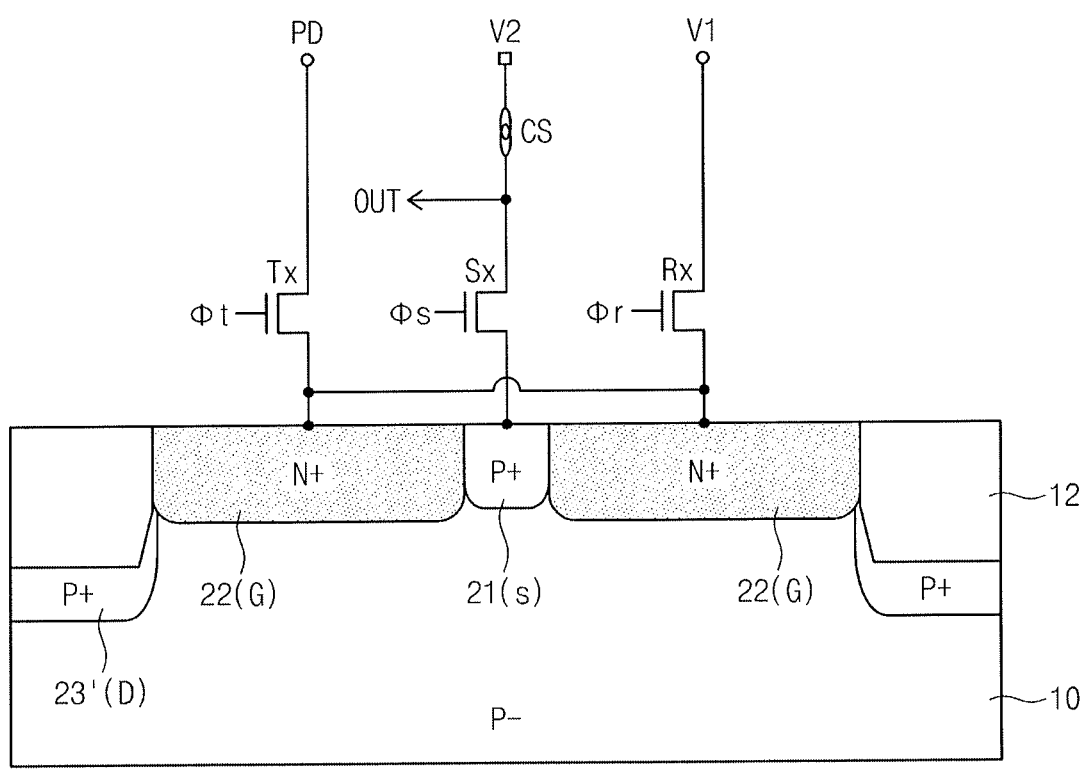
FIG. 7 illustrates a cross-sectional view taken along line X-X' of FIG. 2 to explain a pixel of an image sensor according to other embodiments of the inventive concept.

FIG. 7 illustrates a cross-sectional view taken along line X-X' of FIG. 2 to explain a pixel 120 of an image sensor according to other embodiments of the inventive concept. Only Differences between the present embodiment and the previously described embodiment will be described for the purpose of ease and convenience in explanation.

Referring to FIG. 7, a third dopant region 23' of the pixel 120 is disposed to be adjacent to the second dopant region 22 of the floating sensing node FD. The third dopant region 23' may be disposed under a device isolation insulating layer 12. The third dopant region 23' has a P-type conductivity type. The third dopant region 23 may be a channel stop layer.

Figure 8:
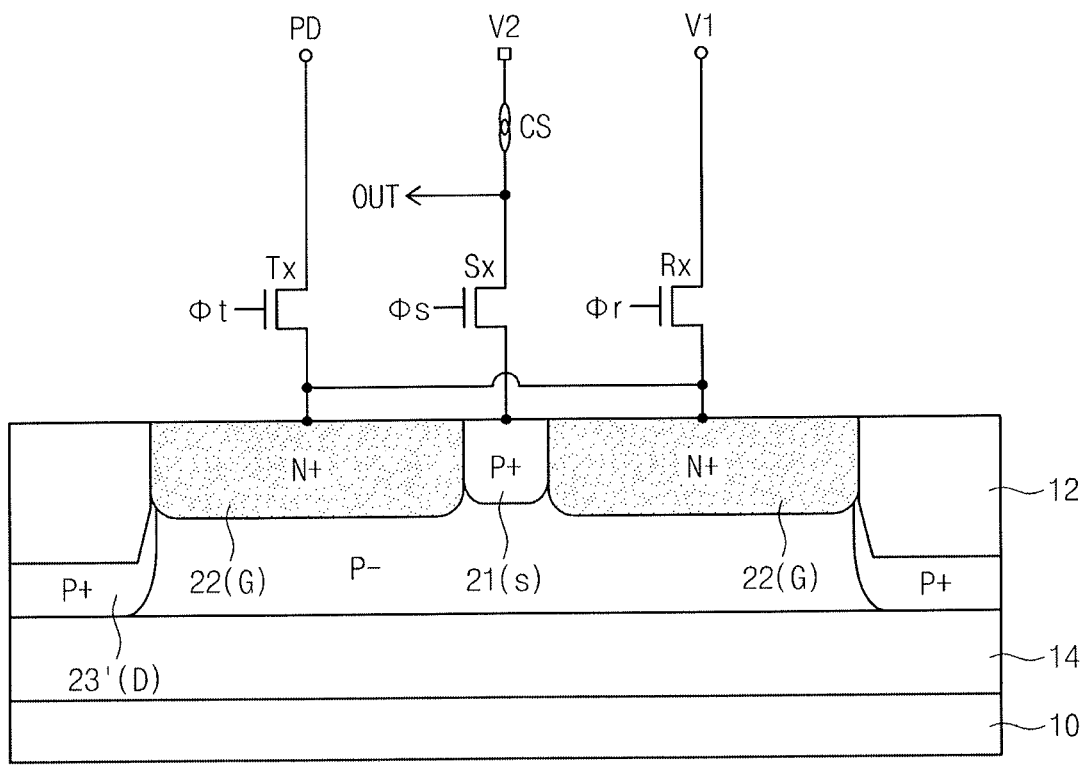
FIGS. 8 and 9 illustrate cross-sectional views taken along line X-X' of FIG. 2 to explain pixels of image sensors according to still other embodiments of the inventive concept.
Figure 9:
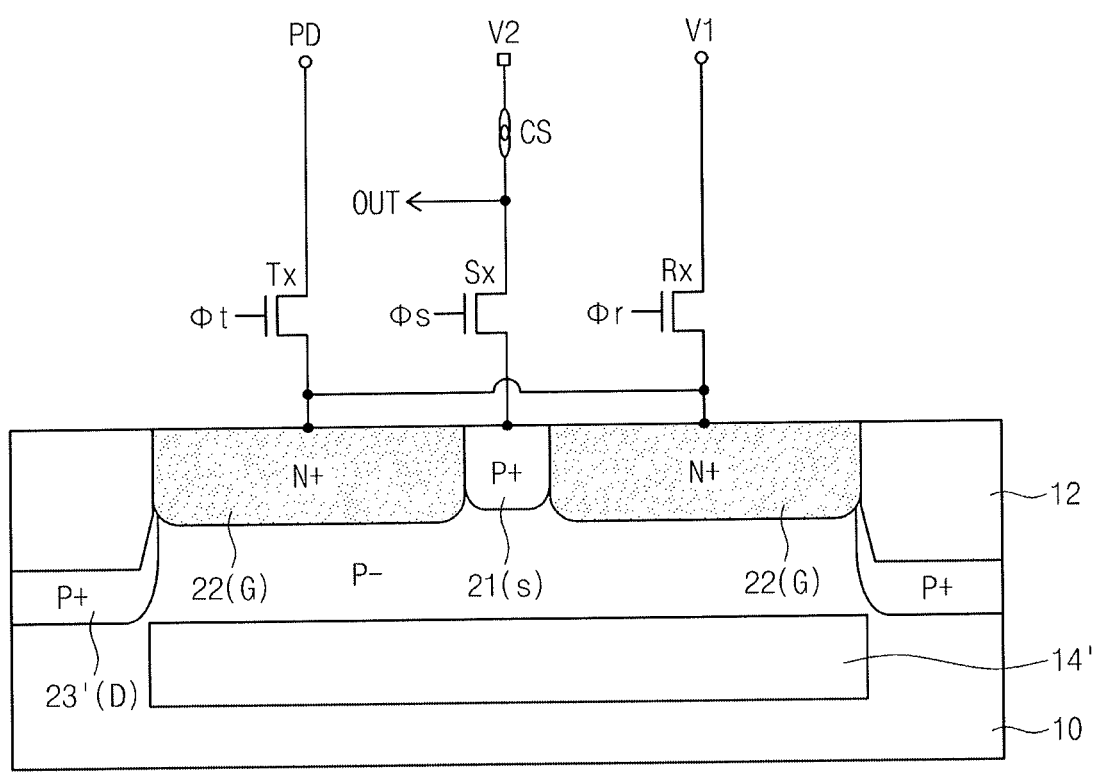

FIGS. 8 and 9 illustrate cross-sectional views taken along line X-X' of FIG. 2 to explain pixels 130 and 131 of image sensors according to still other embodiments of the inventive concept.

Referring to FIG. 8, an embedded insulating layer 14 of the pixel 130 is provided in the substrate 10, e.g., the third dopant region 23' may be positioned between the embedded insulating layer 14 and the device isolation insulating layer 12. The embedded insulating layer 14 may include silicon oxide. The embedded insulating layer 14 may prevent the holes of the p-channel JFET from leaking into the substrate 10. Thus, it is possible to improve sensitivity of the image sensor.

Referring to FIG. 9, an embedded insulating layer 14' of the pixel 131 may be locally provided, e.g., only, under the floating sensing node FD. The embedded insulating layer 14 may include silicon oxide and be doped with oxygen.

Figure 10:
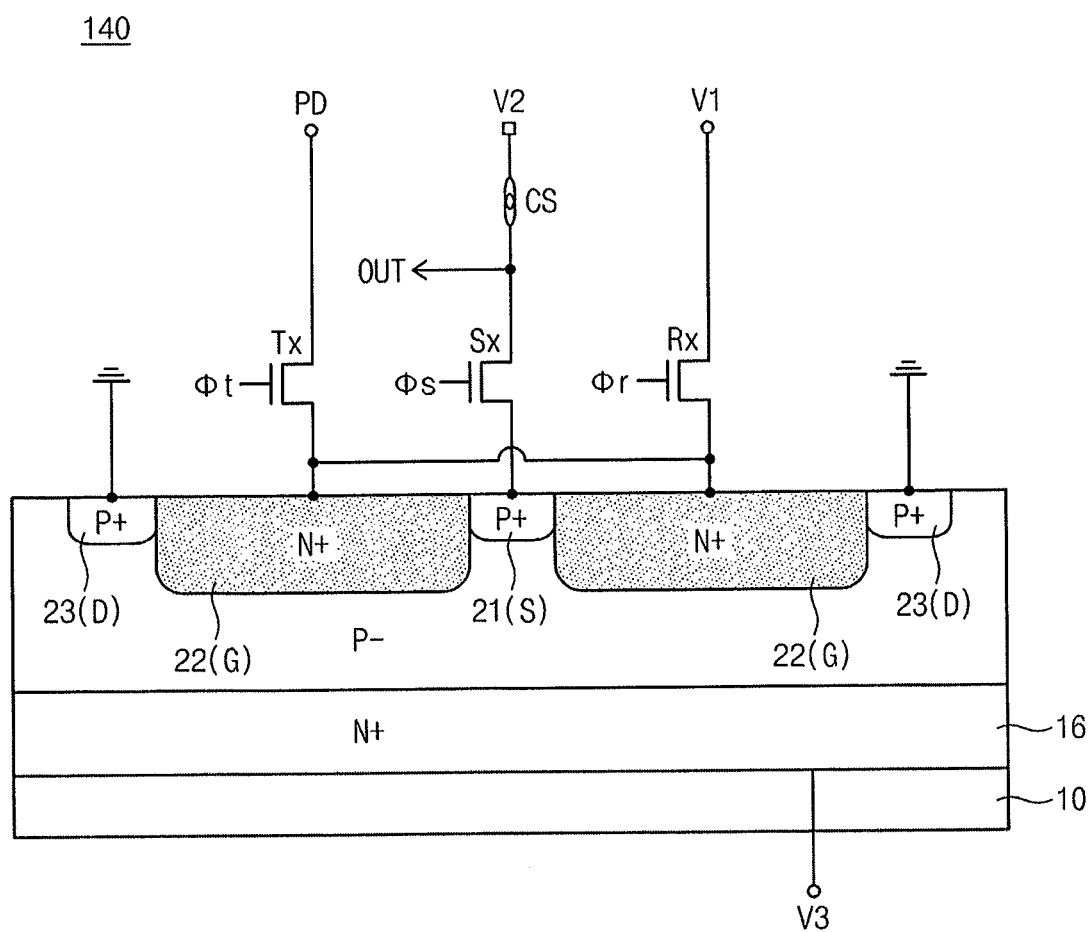
FIGS. 10 and 11 illustrate cross-sectional views taken along line X-X' of FIG. 2 to explain pixels of image sensors according to yet other embodiments of the inventive concept.
Figure 11:
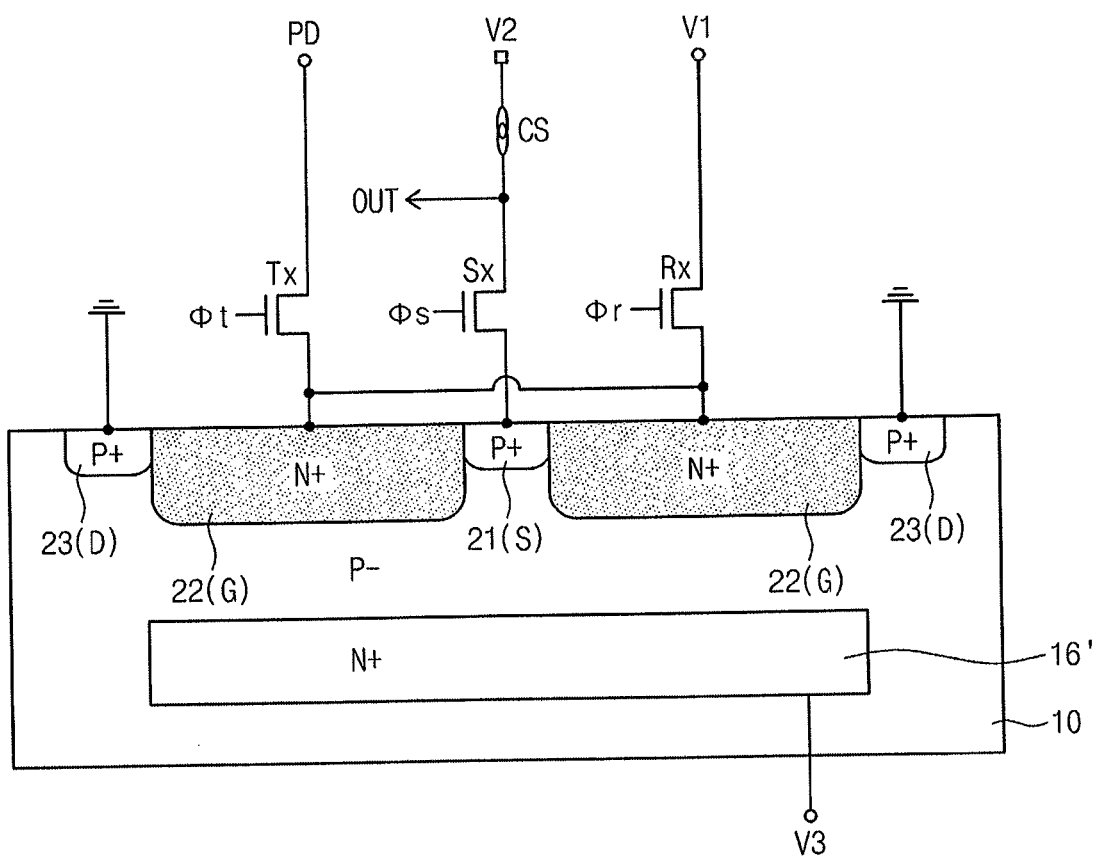

FIGS. 10 and 11 illustrate cross-sectional views taken along line X-X' of FIG. 2 to explain pixels 140 and 150 of image sensors according to yet other embodiments of the inventive concept.

Referring to FIG. 10, a fourth dopant region 16 is provided in the substrate 10. The fourth dopant region 16 may have an N-type conductivity type. The fourth dopant region 16 may be formed by doping a portion of the substrate 10 with N-type dopants. A bias of a third voltage V3 may be applied to the fourth dopant region 16. The third voltage V3 may be equal to the first voltage V1. The fourth dopant region 16 and the second dopant region 22 may function as gates of the JFET. Thus, it is possible to easily control the current flow in the on-off operations of the JFET. Additionally, it is possible to prevent the holes of the P-channel JFET from leaking into the substrate 10. As a result, the sensitivity of the image sensor may be improved.

Referring to FIG. 11, a fourth dopant region 16' may be locally provided, e.g., only, under the floating sensing node FD.

Figure 12:
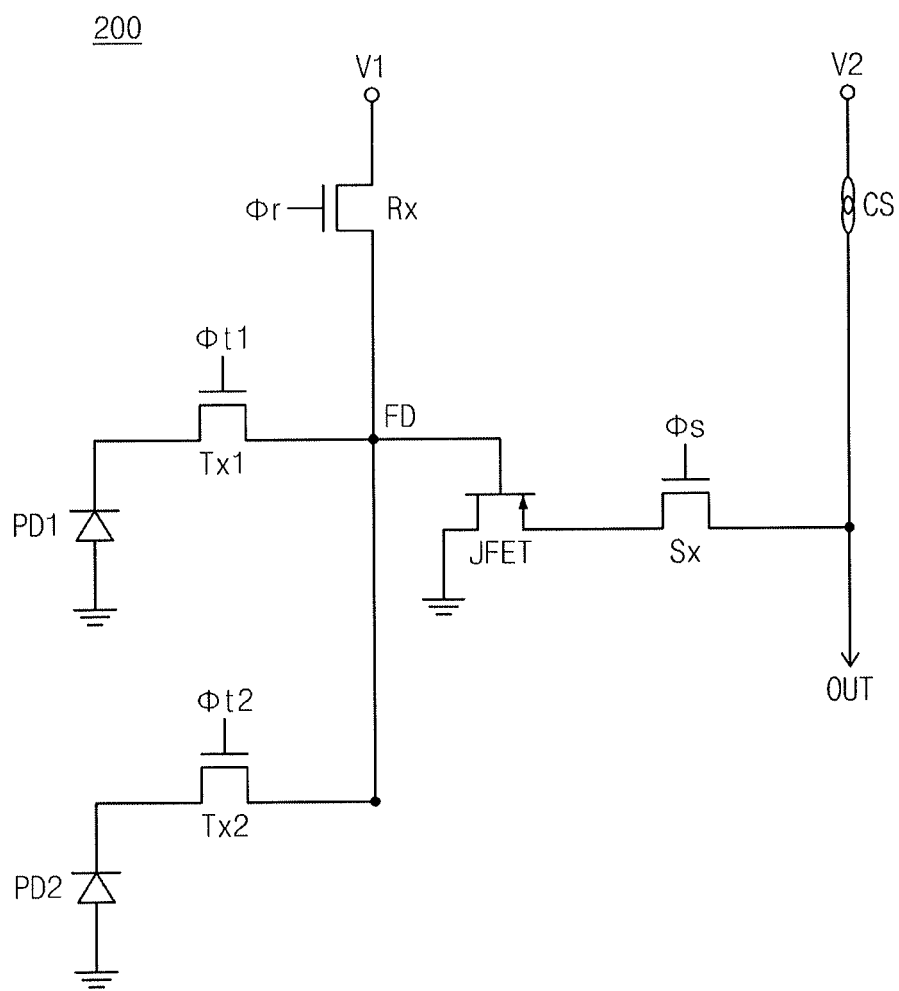
FIG. 12 illustrates a circuit diagram of a shared pixel structure of an image sensor according to embodiments of the inventive concept.

FIG. 12 illustrates a circuit diagram of a shared pixel structure 200 of an image sensor according to embodiments of the inventive concept.

Referring to FIG. 12, the pixels having the structure of FIG. 1 may share the floating sensing node FD, the reset transistor Rx, the selection transistor Sx, and the output terminal OUT. One of two pixels different from each other may include a first photodiode PD1 and a first transfer transistor Tx1, and the other of the two pixels may include a second photodiode PD2 and a second transfer transistor Tx2, which are separated from the first photodiode PD1 and the first transfer transistor Tx1. Operating timings of the shared pixels may be distinguished from each other by transfer control signals Φt1 and Φt2.

Two shared pixels are illustrated as an example in FIG. 12. However, the inventive concept is not limited thereto. The inventive concept may be applied to three or more shared pixels.

As described with reference to FIGS. 1 to 12, the floating sensing node FD includes the first dopant region 21 and the second dopant region 22 surrounding the first dopant region 21, and the first dopant region 21 is connected to the source or drain of the selection transistor Sx. Thus, the selection transistor Sx is substituted for, e.g., functions as, a driver of a source following structure. As such, it is possible to improve integration degree of the pixel structure constituting the image sensor. Additionally, the number of the transistors constituting the driver is reduced to increase a fill factor of the pixel.

The current may flow through a bulk of the substrate 10 by driving of the JFET, which includes, e.g., consists of, the floating sensing node FD and the third dopant region 23. The current flowing through the bulk may further reduce a random telegraph signal (RTS) noise as compared with a current flowing along a surface of the substrate 10. Further, the floating sensing node FD may be fully depleted by the junction between the P-type and N-type dopant regions (i.e., the first and second dopant regions 21 and 22), such that a kTC noise (i.e., a thermal noise of a capacitor) may be reduced and a dark current may be reduced in the floating sensing noise.

Figure 13:
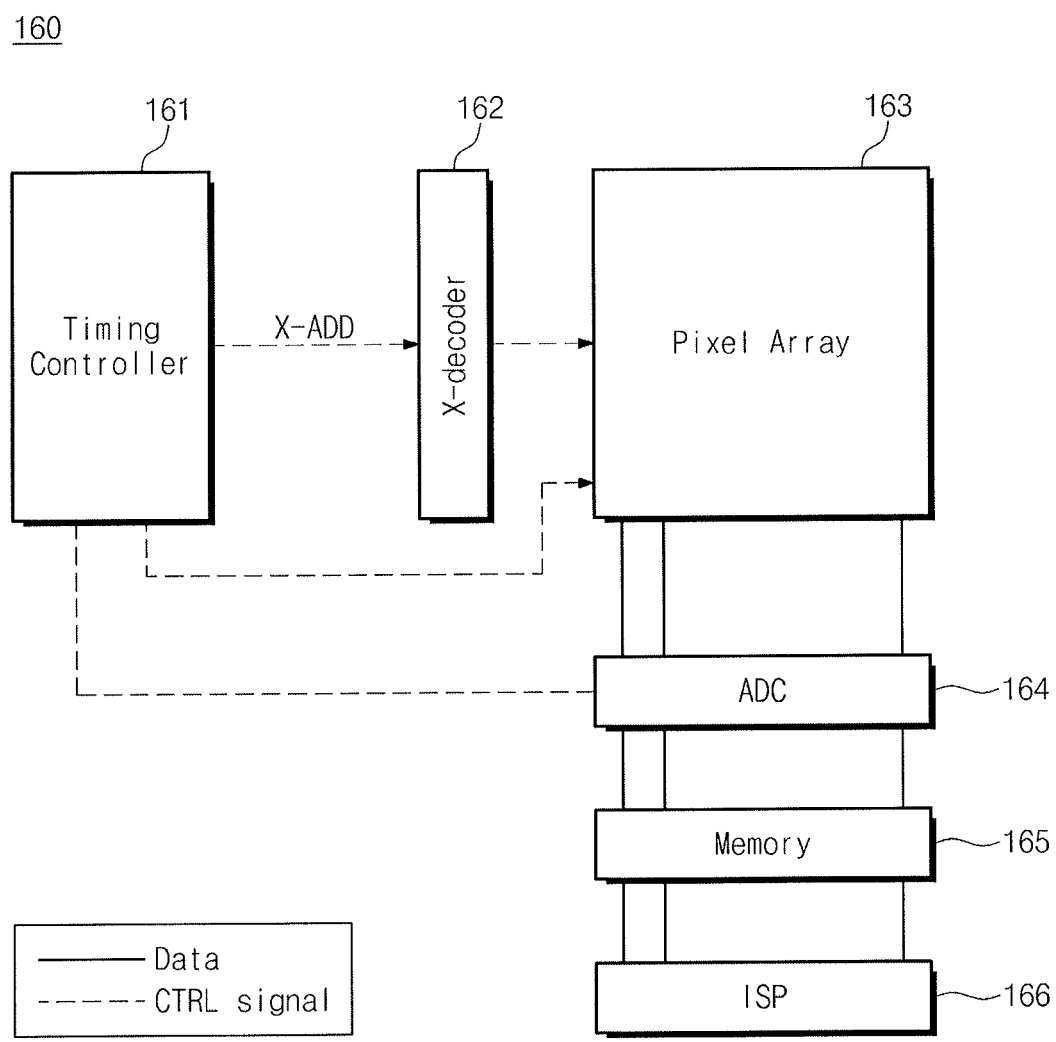
FIG. 13 illustrates a block diagram of an image sensor according to embodiments of the inventive concept.

FIG. 13 illustrates a block diagram of an image sensor according to embodiments of the inventive concept.

Referring to FIG. 13, an image sensor 160 according to embodiments converts an optical signal into an electrical signal, and outputs the electrical signal. A timing controller 161 controls an operating time of the image sensor 160. For example, the timing controller 161 may control a light receiving time by a transfer control signal of the image sensor 160.

The image sensor 160 includes a pixel array 163, an analog digital converter (ADC) 164, an X-address decoder 162, a memory unit 165, and an image signal processor (ISP) 166. The pixel array 163 may include elements and operations described previously with reference to FIGS. 1 to 12. Thus, it is possible to realize the pixel array 163 with high integration and improved noise characteristic.

The ADC 164 converts an analog signal output from the pixel array 163 into a digital signal. The memory unit 165 may function as a buffer memory unit or a frame memory unit. The memory unit 165 may store the converted digital signals of a frame unit. The image signal processor 166 performs a required signal process by using the digital image signals stored in the memory unit 165. The signal process may include, e.g., a color interpolation process, a color correction process, an auto white balance process, a gamma correction process, a color saturation correction process, a formatting process, a bad pixel correction process, and/or a hue correction process.

The X-address decoder 162 may control the operating time of each row of the pixel array 163 by using an address data X-add provided from the timing controller 161.

A structure of the ADC 164 may be changed according to the CDS method such as the analog CDS, the digital CDS, or the dual CDS. Additionally, the ADC 164 may be realized as a column ADC disposed at each column of the pixel array 163 or a single ADC disposed at the pixel array 163.

Figure 14:
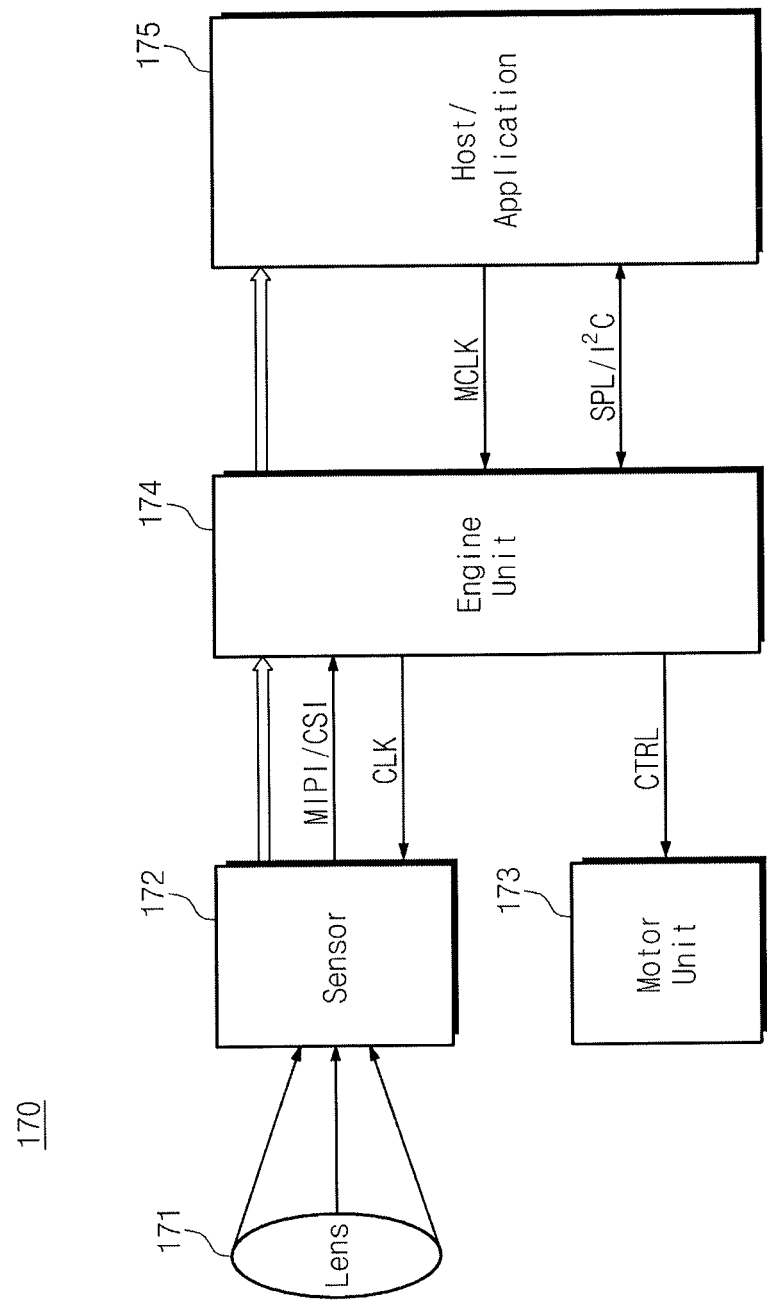
FIG. 14 illustrates a block diagram of a camera system including an image sensor according to embodiments of the inventive concept.

FIG. 14 illustrates a block diagram of a camera system including an image sensor according to embodiments of the inventive concept. For example, the camera system may include a digital camera.

Referring to FIG. 14, a camera system 170 may include a lens 171, an image sensor 172, a motor part 173, and an engine part 174. A pixel array of the image sensor 172 includes the pixel including the floating sensing node and the selection transistor which perform the JFET operation described with reference to FIGS. 1 to 12.

The lens 171 condenses incident light into a light receiving region (e.g., the photodiode) of the image sensor 172. The image sensor 172 generates image data based on the incident light through the lens 171. The image sensor 172 may provide the image data by a clock signal CLK. The image sensor 172 may interface with the engine part 174 through a mobile industry processor interface (MIPI) and/or a camera serial interface (CSI). The motor part 173 may control a focus of the lens 171 or perform a shuttering operation in response to a control signal CTRL received from the engine part 174. The engine part 174 controls the image sensor 172 and the motor part 173. Additionally, the engine part 174 may generate YUV data or compressed data based on a distance and/or the image data received from the image sensor. The YUV data may include a distance from an object, a brightness component, a difference between the brightness component and a blue component, and a difference between the brightness component and a red component. The compressed data may include, e.g., joint photography experts group (JPEG) data. The engine part 174 may be connected to a host/application 175. The engine part 174 may provide the YUV data or the JPEG data to the host/application 175 by a master signal MCLK. Additionally, the engine part 174 may interface with the host/application 175 through a serial peripheral interface (SPI) and/or an inter integrated circuit ($I^2C$).

Figure 15:
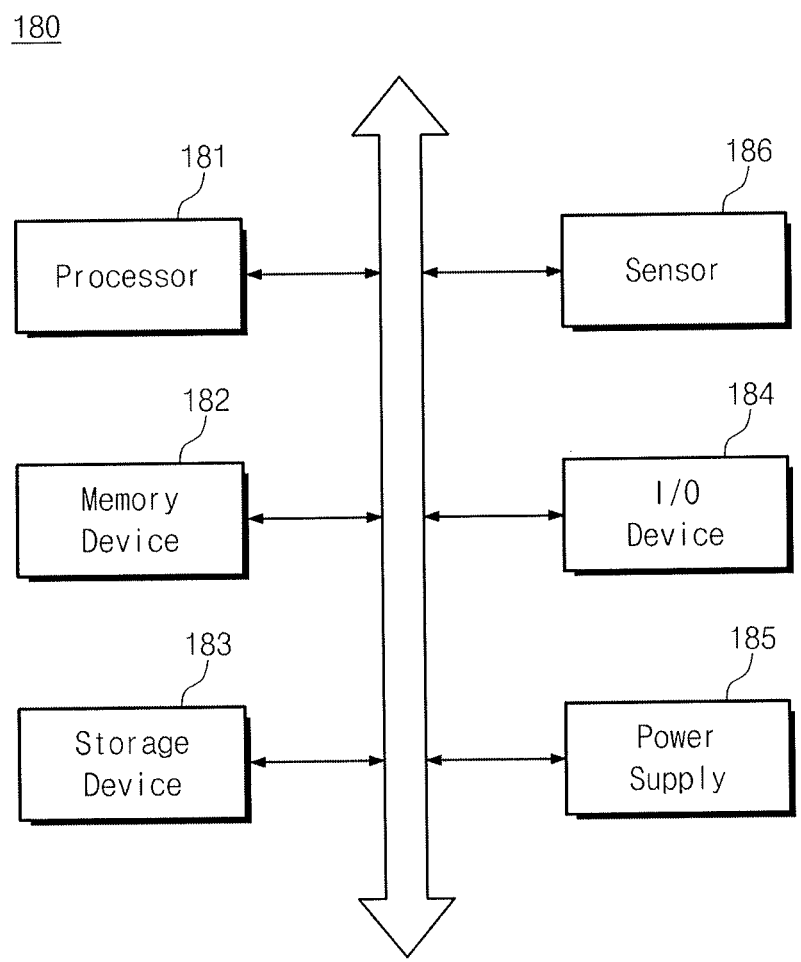
FIG. 15 illustrates a block diagram of a computing system including an image sensor according to embodiments of the inventive concept.

FIG. 15 illustrates a block diagram of a computing system including an image sensor according to embodiments of the inventive concept.

Referring to FIG. 15, a computing system 180 may include a processor 181, a memory device 182, a storage device 183, an input/output (I/O) device 184, a power supply 185, and an image sensor 186. A pixel array of the image sensor 186 includes the pixel described with reference to FIGS. 1 to 12. Even though not shown in FIG. 15, the computing system 180 may further include ports communicating with a video card, a sound card, a memory card, and a USB device or communicating with other electronic devices.

The processor 181 may perform specific calculations or tasks. The processor 181 may include, e.g., a micro-processor or a central processing unit (CPU). The processor 181 may communicate with the memory device 182, the storage device 183, and the I/O device 184 through, e.g., an address bus, a control bus, and a data bus. In some embodiments, the processor 181 may also be connected to an expansion bus, e.g., a peripheral component interconnect (PCI) bus.

The memory device 182 may store data required for operation of the computing system 180. For example, the memory device 182 may include a dynamic random access memory (DRAM) device, a mobile DRAM device, a static random access memory (SRAM) device, a phase change RAM (PRAM) device, a ferroelectrics RAM (FRAM) device, a resistive RAM (RRAM) device, and/or a magnetic RAM (MRAM) device.

The storage device 183 may include, e.g., a solid state drive (SSD), a hard disk drive (HDD), and/or a CD-ROM. The I/O device 184 may include an input unit (e.g., a keyboard, a keypad, and/or a mouse) and/or an output unit (e.g., a printer and/or a display). The power supply 185 may supply an operating voltage required for the operation of the computing system.

The image sensor 186 may communicate with the processor 181 through the buses and/or another communication link. The image sensor 186 and the processor 181 may be integrated on one chip. Alternatively, the image sensor 186 and the processor 181 may be integrated on chips different from each other, respectively. The computing system 186 may be one of various computing systems using the image sensor 186. For example, the computing system 180 may include a digital camera, a portable phone, a personal digital assistant (PDA), a portable multimedia player (PMP), and/or a smart phone.

Figure 16:
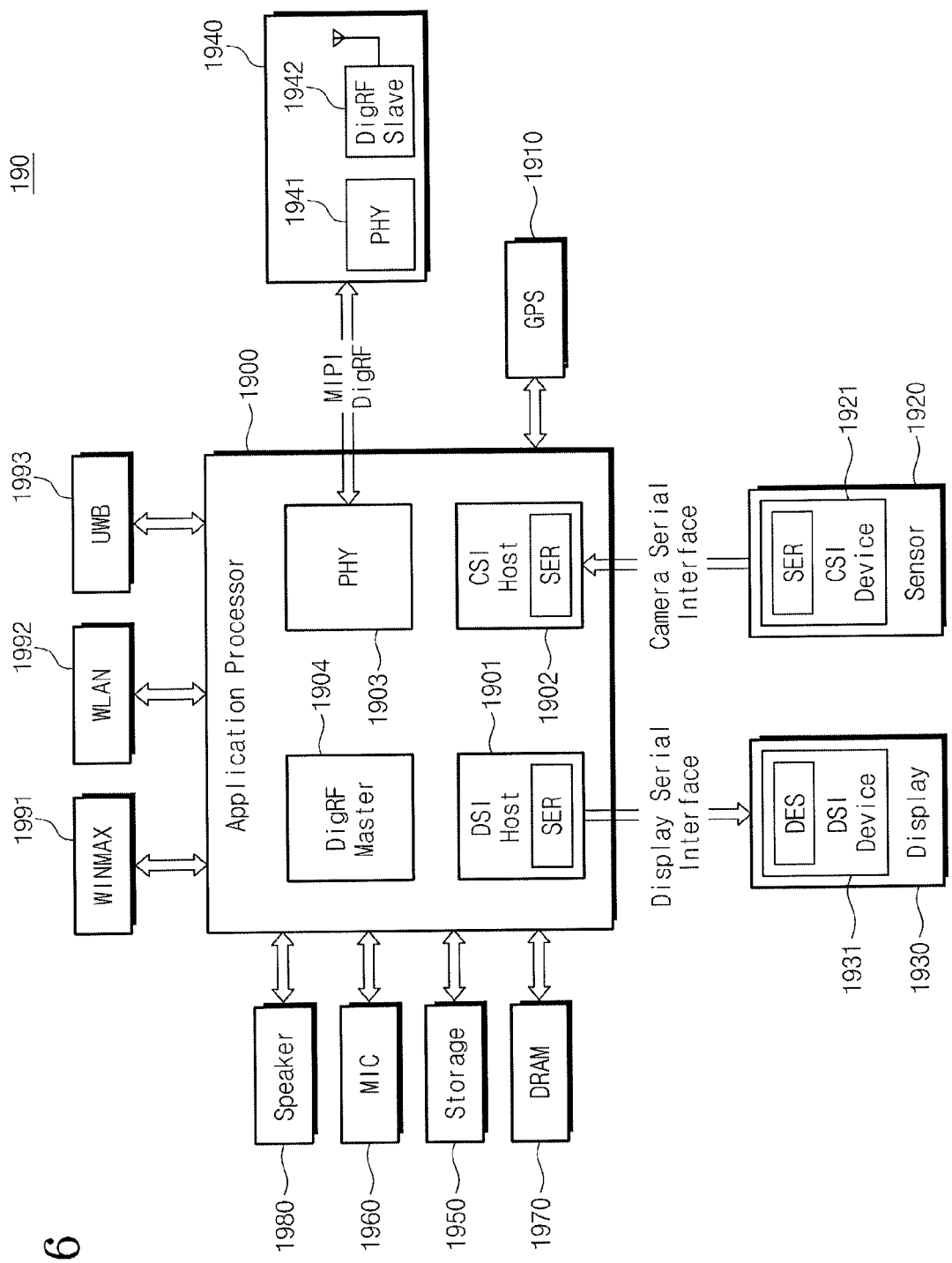
FIG. 16 illustrates a block diagram of an example of interface units used in the computing system of FIG. 15.

FIG. 16 illustrates a block diagram of exemplary interface units used in the computing system of FIG. 15.

Referring to FIG. 16, a computing system 190 may be realized as a data processing device capable of using or supporting the MIPI. Additionally, the computing system 190 may include an application processor (AP) 1900, an image sensor 1920, and a display device 1930. A camera serial interface (CSI) host 1902 of the AP 1900 may perform serial communication with a CSI device 1921 in the image sensor 1920 through a CSI. In an embodiment, the CSI host 1902 may include a deserializer (DES), and the CSI device 1921 may include a serializer (SER). A pixel array of the image sensor 1920 may include one of the pixel structures illustrated in FIGS. 1 to 12.

A display serial interface (DSI) host 1901 may perform serial communication with a DSI device 1931 of the display device 1930 through a DSI. In an embodiment, the DSI host 1901 may include a SER, and the DSI device 1931 may include a DES. The computing system 190 may further include a radio frequency (RF) chip 1940 which may communicate with the AP 1900. A physical layer (PHY) 1903 of the AP 1900 and a PHY 1941 of the RF chip 1940 may perform data transmission/reception according a MIPI DigRF. Additionally, the AP 1900 may further include a DigRF master 1904 controlling data transmission/reception according to the MIPI DigRF of the PHY 1903

The computing system 190 may further include a global positioning system (GPS) 1910, a storage 1950, a microphone 1960, a dynamic random access memory (DRAM) device 1970, and a speaker 1980. Additionally, the computing system 190 may perform communication through a ultra wideband (UWB) 1993, a wireless local area network (WLAN) 1992, and a worldwide interoperability for microwave access (WIMAX) 1991. However, the interface and the structure of the computing system 190 are not limited thereto.

Figure 17:
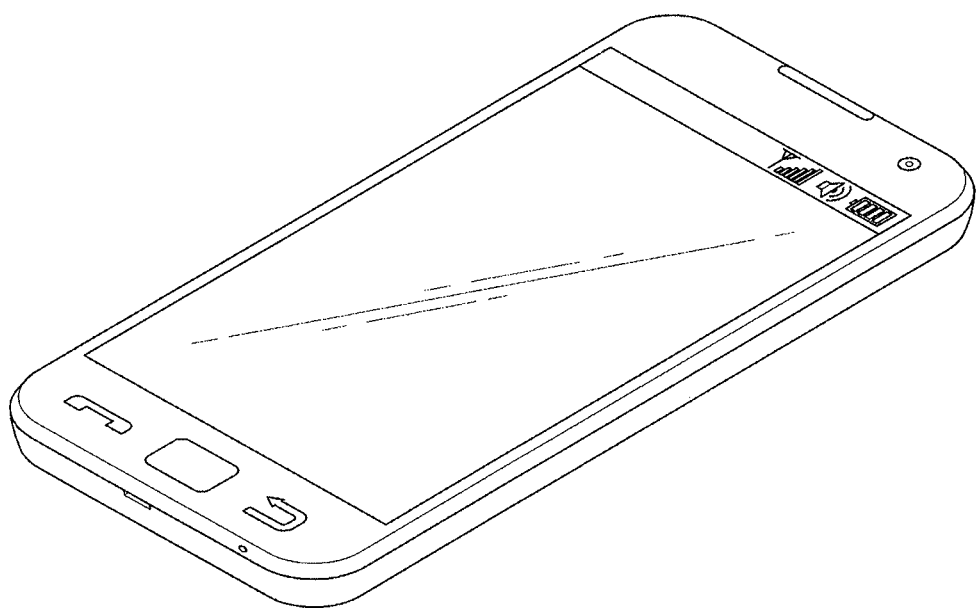
FIGS. 17 to 21 show other examples of multimedia devices applied with image sensors according to embodiments of the inventive concept.
Figure 18:
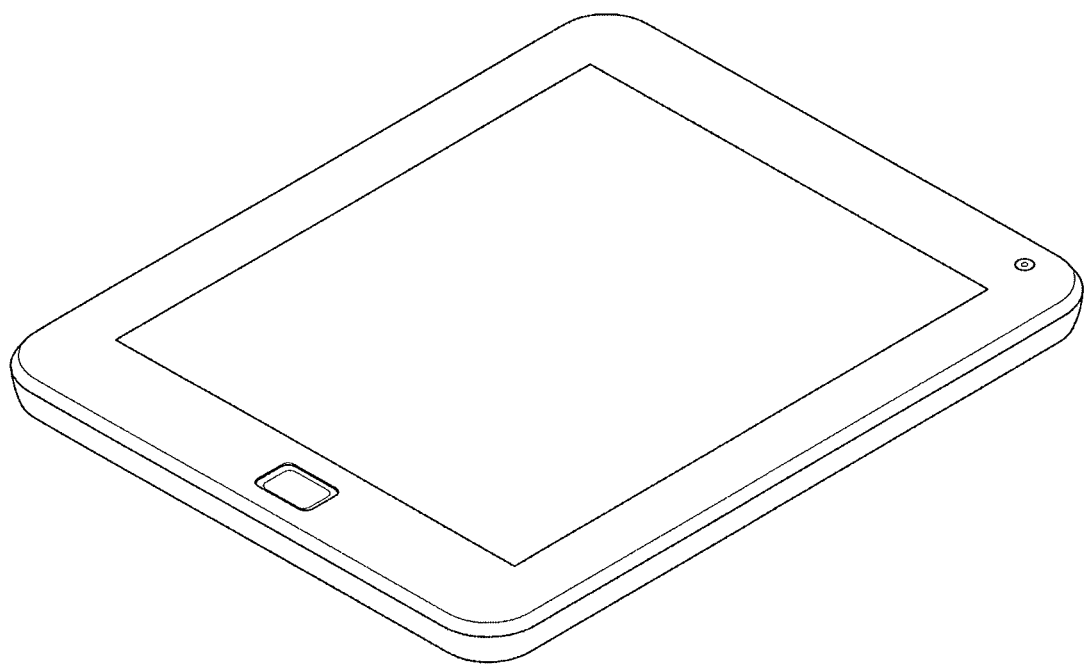
Figure 19:
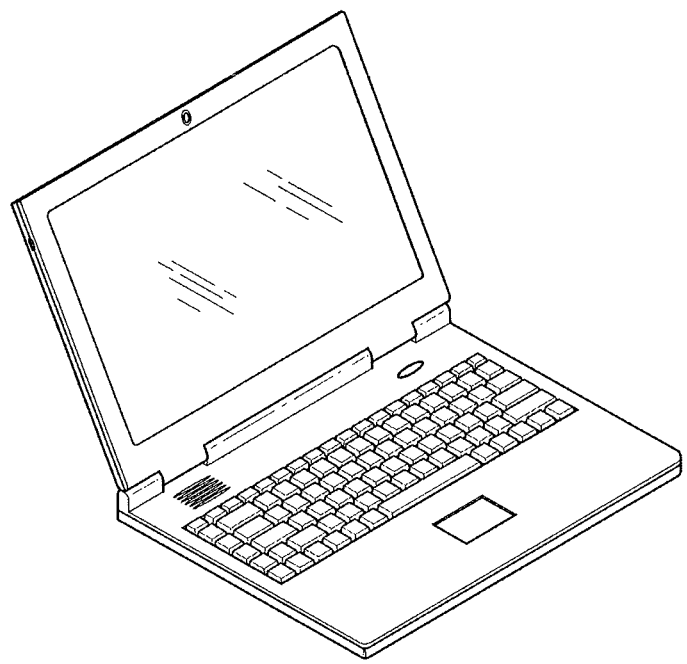
Figure 20:
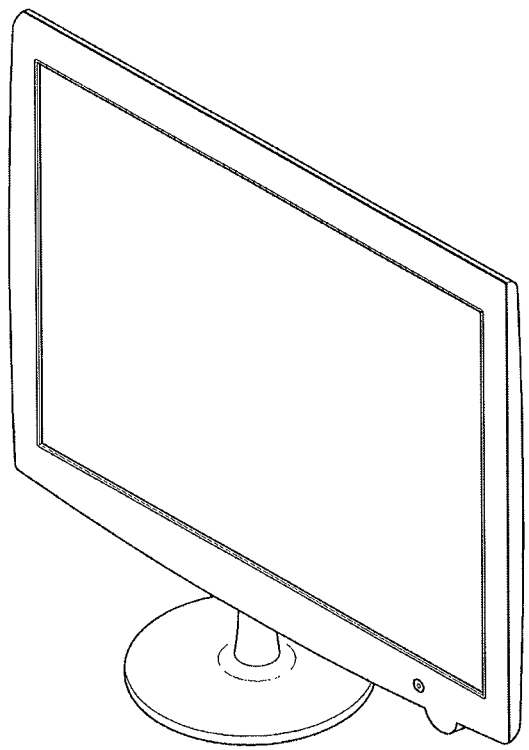
Figure 21:
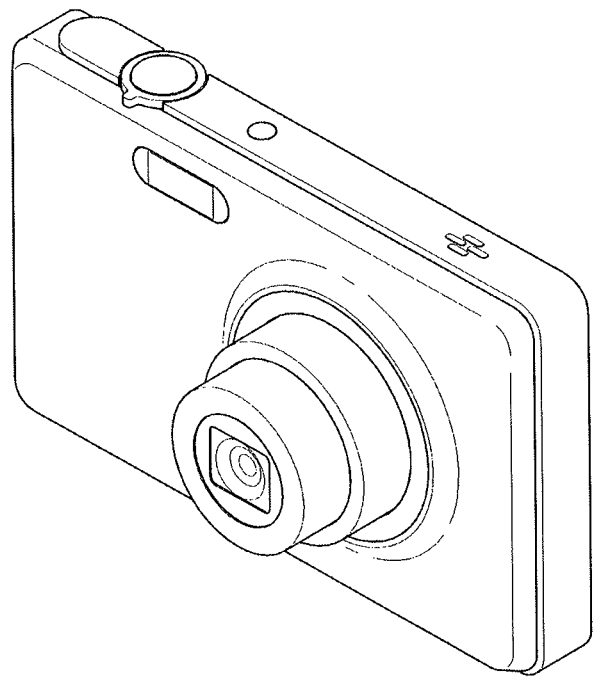

FIGS. 17 to 21 show other examples of multimedia devices applied with image sensors according to embodiments of the inventive concept. The image sensor according to the aforementioned embodiments may be applied to various multimedia devices including a function photographing an image. In some embodiments, the image sensor according to the inventive concept may be applied to a mobile or smart phone 1000, as illustrated in FIG. 17. In other embodiments, the image sensor according to the inventive concept may be applied to a tablet or smart tablet 2000, as illustrated in FIG. 18. In still other embodiments, the image sensor according to the inventive concept may be applied to a notebook computer 3000, as illustrated in FIG. 19. In even other embodiments, the image sensor according to the inventive concept may be applied to a television or smart television 4000, as illustrated in FIG. 20. In yet other embodiments, the image sensor according to the inventive concept may be applied to a camera or digital camcorder 5000, as illustrated in FIG. 21.

According to embodiments of the inventive concept, an input transistor corresponding to the source follower may be removed in the pixel of a CMOS image sensor, so that the integration degree and the fill factor of the CMOS image sensor may be improved. Further, the current flows through the bulk of the substrate to reduce the random telegraph signal (RTS) noise and flicker noise.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a photodiode to convert a received optical signal into photo charges and to output the photo charges;
a sensing node, adjacent to the photodiode, to sense the photo charges, the sensing node including:
a first dopant region having dopants of a first conductivity type, and
a second dopant region having dopants of a second conductivity type, the second dopant region surrounding the first dopant region;
a third dopant region adjacent to the second dopant region and having dopants of the first conductivity type, the third dopant region being disposed around the sensing node; and
a driver to convert the sensed photo charges into an electrical signal and to output the electrical signal, wherein the first dopant region, the second dopant region, and the third dopant region are to operate as a source, a gate, and a drain of a junction field effect transistor, respectively.

2. The image sensor as claimed in claim 1, wherein the driver includes a selection transistor to operate as a source follower outputting a signal according to a voltage level of the sensing node, a source of the selection transistor being connected to the first dopant region.

3. The image sensor as claimed in claim 2, wherein a drain of the selection transistor is connected to an output terminal.

4. The image sensor as claimed in claim 3, further comprising a first voltage and a current source connected in series to the drain of the selection transistor.

5. The image sensor as claimed in claim 4, further comprising a transfer transistor disposed between the photodiode and the sensing node, the transfer transistor to transfer the photo charges into the sensing node in response to a transfer control signal.

6. The image sensor as claimed in claim 5, further comprising a reset transistor connected to a second voltage and to the second dopant region of the sensing node, the reset transistor to reset the second dopant region to a voltage level of the second voltage in response to a reset control signal.

7. The image sensor as claimed in claim 6, wherein the transfer transistor and the reset transistor are connected in common to the second dopant region.

8. The image sensor as claimed in claim 6, wherein the second voltage has a higher voltage level than the first voltage.

9. The image sensor as claimed in claim 8, wherein the transfer transistor is to be turned-on by the transfer control signal, such that a voltage level of the sensing node is changed from the voltage level of the second voltage into a voltage level generated by the photo charges transferred from the photodiode.

10. An image sensor, comprising:
a photodiode to convert a received optical signal into photo charges and to output the photo charges;
a sensing node, adjacent to the photodiode, to sense the photo charges, the sensing node including a first dopant region having dopants of a first conductivity type and a second dopant region having dopants of a second conductivity type, the second dopant region surrounding the first dopant region;

a third dopant region adjacent to the second dopant region and disposed around the sensing node, the third dopant region having dopants of the first conductivity type;

a transfer transistor connected between the photodiode and the sensing node; and a selection transistor connected between the sensing node and an output terminal, the selection transistor to operate as a source follower and to output a voltage level corresponding to the photo charges of the sensing node through the output terminal in response to a selection control signal, wherein the first dopant region, the second dopant region, and the third dopant region are to operate as a source, a gate, and a drain of a junction field effect transistor, respectively.

11. The image sensor as claimed in claim 10, wherein a source of the selection transistor is connected to the first dopant region.

12. The image sensor as claimed in claim 11, wherein a drain of the selection transistor is connected between a first voltage and the output terminal.

13. The image sensor as claimed in claim 12, further comprising a reset transistor connected to a second voltage and the second dopant region of the sensing node, the reset transistor to reset the second dopant region to a voltage level of the second voltage in response to a reset control signal.

14. The image sensor as claimed in claim 13, wherein the transfer transistor and the reset transistor are connected in common to the second dopant region.

15. The image sensor as claimed in claim 13, wherein the second voltage has a higher voltage level than the first voltage.

16. An image sensor, comprising:

a photodiode to convert a received optical signal into photo charges and to output the photo charges;

a sensing node, adjacent to the photodiode, to sense the photo charges, the sensing node including a first dopant region having dopants of a first conductivity type and a second dopant region having dopants of a second conductivity type, the second dopant region surrounding the first dopant region;

a transfer transistor connected between the photodiode and the sensing node; and a selection transistor connected between the sensing node and an output terminal, the selection transistor to operate as a source follower and to output a voltage level corresponding to the photo charges of the sensing node through the output terminal in response to a selection control signal, wherein the sensing node and the selection transistor are connected to each other through a junction field effect transistor formed by the first and second dopant regions.

17. The image sensor as claimed in claim 16, wherein the first and the second conductivity types are a P-type and an N-type, respectively.

18. The image sensor as claimed in claim 16, wherein a source of the selection transistor is connected to the first dopant region, and wherein the second dopant region is used as a source/drain junction of the transfer transistor.

\* \* \* \* \*